United States Patent
Ambroladze et al.

(10) Patent No.: US 8,595,570 B1
(45) Date of Patent: Nov. 26, 2013

(54) BITLINE DELETION

(75) Inventors: Ekaterina M. Ambroladze, Wappingers Falls, NY (US); Patrick J. Meaney, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/523,624

(22) Filed: Jun. 14, 2012

(51) Int. Cl.
*G06F 11/27* (2006.01)
*G06F 11/32* (2006.01)

(52) U.S. Cl.
USPC .......................................... 714/708; 714/718

(58) Field of Classification Search
None
See application file for complete search history.

(56) References Cited

U.S. PATENT DOCUMENTS

| | | | |
|---|---|---|---|
| 5,748,543 A * | 5/1998 | Lee et al. | 365/200 |
| 7,626,869 B2 | 12/2009 | Wang et al. | |
| 7,734,966 B1 * | 6/2010 | Lee et al. | 714/718 |
| 2002/0133760 A1 * | 9/2002 | Ahrens et al. | 714/57 |
| 2005/0028039 A1 | 2/2005 | Henderson et al. | |
| 2006/0248392 A1 * | 11/2006 | Barlow et al. | 714/30 |
| 2008/0301530 A1 | 12/2008 | Spanel et al. | |
| 2010/0268984 A1 | 10/2010 | Guthrie et al. | |

FOREIGN PATENT DOCUMENTS

| | | |
|---|---|---|
| EP | 0494547 A2 | 7/1992 |
| JP | 2009295232 A | 12/2009 |
| KR | 2010088915 A | 8/2010 |

OTHER PUBLICATIONS

D. Henderson, et al., "IBM POWER6 Processor-Based Systems: Designed for Availabilty," Jun. 11, 2007; pp. 1-13.

* cited by examiner

*Primary Examiner* — Ajay Bhatia
*Assistant Examiner* — Dipakkumar Gandhi
(74) *Attorney, Agent, or Firm* — Cantor Colburn LLP; John Campbell

(57) ABSTRACT

Embodiments relate to a method for bitline deletion include, based on detecting a high bitline error rate condition in the cache at a selected bitline address, wherein the high bitline error rate condition indicates a high rate of errors at the selected bitline address, activating the programmable switch in the cache. The method also includes, based on the programmable switch being activated and encountering an error associated with the selected bitline address, automatically deleting, by the computer system, one or more cache lines associated with subsequent errors in the cache regardless of an address of the subsequent errors based on the activated programmable switch, wherein the automatic line deletion indicates a line is unavailable.

21 Claims, 6 Drawing Sheets

BITLINE DELETION

BACKGROUND

The present embodiments relate generally to memory in a computing system, and more specifically, to handling errors in memory.

Computer systems often have a considerable amount of cache and high speed random access memory (RAM) to hold information, such as data and programs, temporarily when a computer is powered and operational. This information is normally binary, composed of patterns of 1's and 0's known as bits of data. The bits of data are often grouped and organized at a higher level. A byte, for example, is typically composed of 8 bits; more generally these groups or bytes are called symbols and may consist of any number of bits or sub-symbols.

Memory device densities have continued to grow as computer systems have become more powerful. Unfortunately, the failure of just a portion of a memory device, such as a cache or RAM, can lead to significantly reduced performance. When memory errors occur, which may be "hard" (repeating) or "soft" (one-time or intermittent) failures, these failures may occur as single cell, multi-bit, wordline or bitlines and may cause all or part of the memory device to be unusable until it is repaired.

In the case of failures in a cache, a failure of a bitline is a hard error that causes errors each time a line that includes the failed bitline is accessed. In some cases, the failed bitline in a line may cause an uncorrectable error (UE) when there is a second error (e.g. a soft error or a second bitline error) as the error correction code (ECC) is only able to correct one error in the line at a time. Thus, cache performance is adversely affected by a failed bitline, as it may cause CEs that would ordinarily be quickly corrected by ECC to require additional processes to access the correct data. Therefore, it is important to clean up all errors associated with a first bitline error (e.g., using line delete or array repair) long before a second bitline or a soft error occurs.

SUMMARY

Embodiments relate to a computer system for bitline deletion, the system including a cache and a programmable switch, the system configured to perform a method including, based on detecting a high bitline error rate condition in the cache at a selected bitline address, wherein the high bitline error rate condition indicates a high rate of errors at the selected bitline address, activating the programmable switch in the cache. The method also includes, based on the programmable switch being activated and encountering an error associated with the selected bitline address, automatically deleting, by the computer system, one or more cache lines associated with subsequent errors in the cache regardless of an address of the subsequent errors based on the activated programmable switch, wherein the automatic line deletion indicates a line is unavailable.

Embodiments relate to a method for bitline deletion including, based on detecting a high bitline error rate condition in the cache at a selected bitline address, wherein the high bitline error rate condition indicates a high rate of errors at the selected bitline address, activating the programmable switch in the cache. The method also includes, based on the programmable switch being activated and encountering an error associated with the selected bitline address, automatically deleting, by the computer system, one or more cache lines associated with subsequent errors in the cache regardless of an address of the subsequent errors based on the activated programmable switch, wherein the automatic line deletion indicates a line is unavailable.

BRIEF DESCRIPTION OF THE SEVERAL VIEWS OF THE DRAWINGS

The subject matter which is regarded as embodiments is particularly pointed out and distinctly claimed in the claims at the conclusion of the specification. The forgoing and other features, and advantages of the embodiments are apparent from the following detailed description taken in conjunction with the accompanying drawings in which:

DETAILED DESCRIPTION

In embodiments, the method, system and computer program product described herein provide improved bitline deletion following failure of a bitline in a memory device, such as a cache. In an embodiment, logic within cache hardware provides blocks to determine a bitline failure and controls a programmable switch to delete or remove the failed bitline from use in the cache. In another embodiment, logic is implemented in software to determine a bitline failure and controls a programmable switch to delete or remove the failed bitline from use in the cache. The embodiment deletes the failed bitline with improved accuracy and speed as compared to a system that is not configured to identify bitline failures. Errors that occur during reading or accessing of cache lines may be determined by a suitable technique, such as by using error correction codes (ECCs) or parity bits. A bitline error condition may be detected or enabled based on the detected errors. For example, if a number of consecutive errors match bitline addresses and are greater than a threshold, the bitline error condition is detected. In an embodiment, the bitline address of the failed bit(s) in a line being read is compared to bitline addresses of the previous failed line, where a match of the failed bitline addresses causes a counter, in software or hardware, to increment. When the counter reaches a selected threshold, a bitline error condition is detected for the cache. The bitline error condition activates a programmable switch in the cache, where the programmable switch causes line deletes for all subsequent errors in the cache regardless of a bitline or wordline address of the error. In an embodiment, a line delete causes deletion of the location of the selected line from available cache (e.g. from cache directory), thus preventing further use of the selected cache line, improving cache reliability. In embodiments, an error is detected and an address for the error is recorded, wherein a mechanism, such as error control code (ECC) purges the bad data and corrects the error. Accordingly, after detecting each error, the erroneous contents of the cache location are cleared and the correct information, which was expected to be in the location, is accessed from another location in memory, such as a higher level (closer to main memory) location. In another example, such as a soft error, an error is detected and is purged, where the bad data is removed and the correct data is accessed in another memory location. Since the error was correctable, the purge operation was used to correct the error and the location in cache where the error occurred remains part of the available cache.

Figure 1:
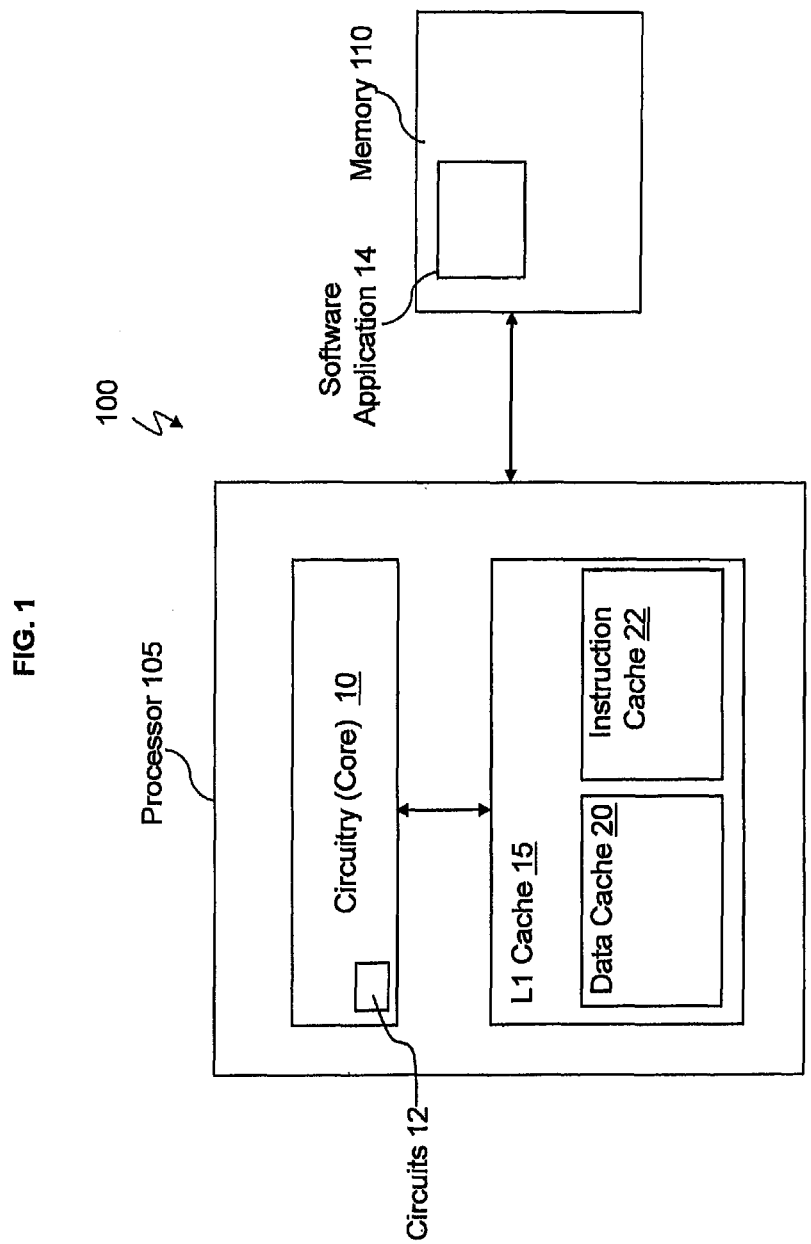
FIG. 1 illustrates a block diagram of a computing system for storing and retrieving data in a memory in accordance with an embodiment.

Turning now to FIG. 1, a block diagram of a system 100 is generally shown according to an embodiment. The system 100 includes a processor 105. The processor 105 has one or more processor cores, and the processor core may be referred to as circuitry 10. The processor 105 may include a level one (L1) cache 15. Although an L1 cache is shown, exemplary embodiments may be implemented in any suitable cache, such as L1 cache, L2 cache and L3 cache, as desired. The L1 cache 15 includes an L1 data cache 20 (D-cache) and an L1 instruction cache 22 (I cache). In an embodiment, the data cache 20 is on-processor (hardware) memory for caching (i.e., storing) data on the processor 105. Data retrieved from memory 110 may be cached in the data cache 20 while instructions of program code 115 retrieved from the memory 110 may be cached in the instruction cache 22 (e.g., on-processor, hardware, memory). Embodiments of the request prioritization may occur in the data cache 20 and/or instruction cache 22.

The circuits 12 may be application specific integrated circuits (ASIC), field programmable gate arrays (FPGA), etc. Also, the logic of the circuits 12 may be implemented as software code illustrated as a software application 14 in one implementation. Any reference to the functions, logic, and features for the circuits 12 applies to the software application 14 as understood by one skilled in the art.

Figure 2:
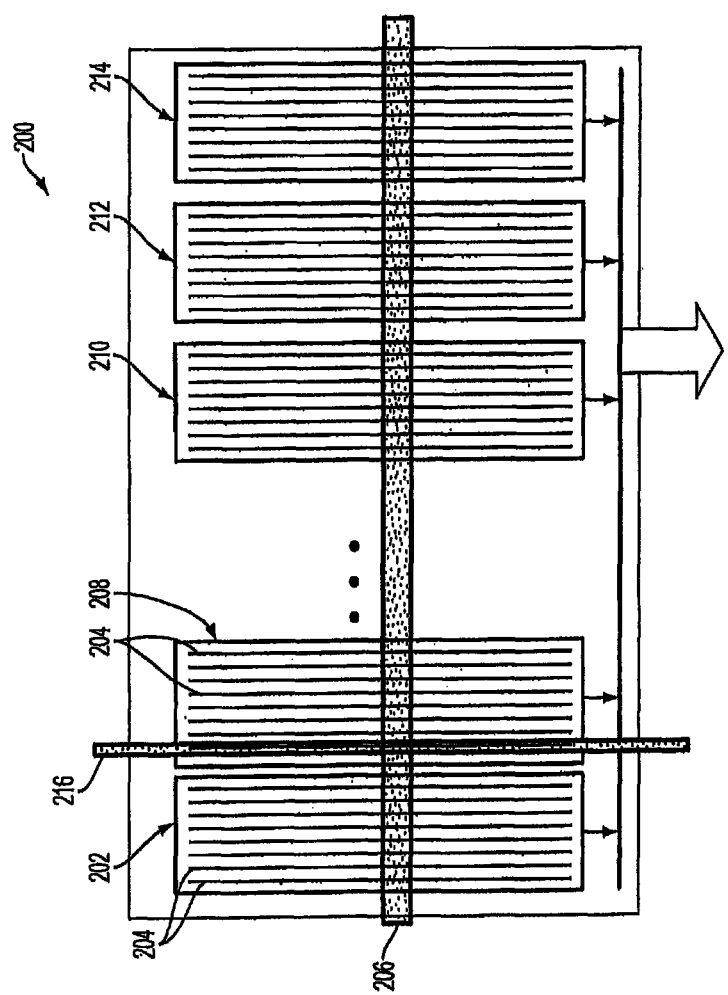
FIG. 2 illustrates a diagram of a cache memory utilizing a bitline monitoring and deletion process in accordance with an embodiment.

FIG. 2 is a schematic diagram of an exemplary cache 200 memory utilizing a bitline monitoring and deletion process. In an embodiment, the cache 200 is organized into a plurality of blocks 202, 208, 212 and 214, where each block includes a plurality of bitlines 204. In one example, the first bitline 204 of each block may be read together as a set when accessing a wordline 206. As depicted, the wordline 206 is a word or "row" including a plurality of sets each set including a plurality of bits in bitlines 204. In an embodiment, each bitline 204 location within a block corresponds to a syndrome. Thus, in an embodiment, a bitline address corresponds to a selected bitline 204 in a selected set. In an embodiment, when accessing a specific line within a wordline 206 of the cache 200, a set is specified in addition to the wordline 206. When a bitline failure occurs, such as in bitline 216, an error will result each time the set that includes bitline 216 is accessed. The error may be considered a hard error because the error persists over time. An error checking process, such as an error correction code (ECC), may be used to detect and correct the error(s), however the process may be limited in detecting and correcting a plurality of errors in a line. Therefore, a soft error, which is ordinarily correctable, may not be corrected, due to the additional error caused by the bitline 216 failure where the ECC cannot correct a plurality of errors in a line.

Figure 3:
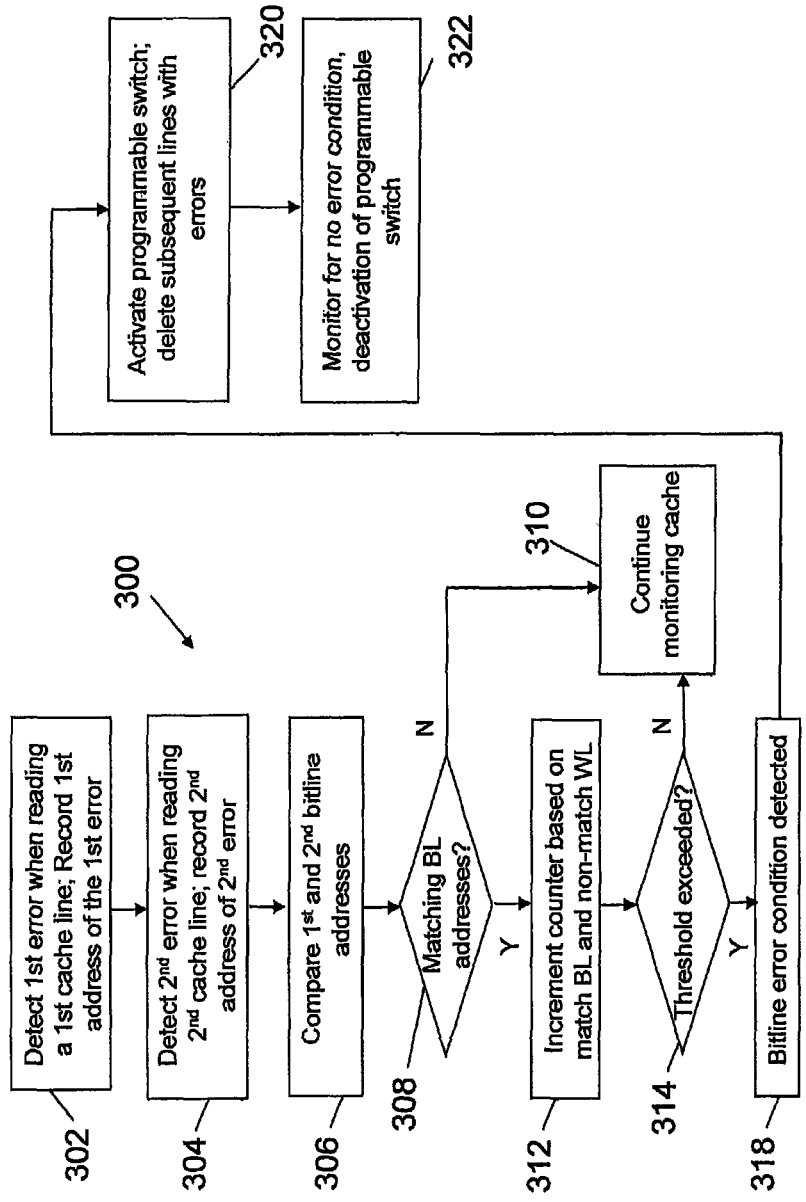
FIG. 3 illustrates a flow diagram of a method and system for detecting and deleting cache lines in accordance with an embodiment.

FIG. 3 is an exemplary flow diagram 300 of a method and system for detecting and deleting failing bitlines in a cache, such as cache 200. The method and system may be implemented in logic in cache hardware and/or in software, where the control of a programmable switch causes line deletion when a bitline error condition (also referred to as "high bitline error condition") is detected. In block 302, a first error is detected when reading a first cache line of a cache, the error detection occurring by a suitable method, such as by ECC or parity bits. A first address, including a bitline and wordline address, of the first error is then recorded in a suitable location, such as in software or a register. In block 304, a second error is detected when reading a second cache line of the cache. The second address, including a bitline and wordline address, corresponding to the second error is recorded, such as in software or a register. In block 306, the second address is compared to the first address. If the first bitline address and second bitline address do not match in block 308, the cache monitoring for errors continues, as depicted in block 310. In block 312, a software or hardware counter is incremented based on a match between the first and second bitline addresses and a non-matching comparison of the first and second wordline addresses. In block 314, the counter value is compared to a threshold. In an embodiment, the threshold comparison includes a time input, where the threshold is only exceeded if a selected number of matches occur during a selected time period. The time input may be provided by using a time stamp associated with the error detections. For example, a threshold may be exceeded when three matching bitline errors occur in a nine hour time period. In block 310, if the counter value does not exceed the threshold within a certain time or without a time input, cache operations continue to be monitored. Accordingly, a subsequent error detected during a cache line read may lead to block 302, where errors with matching bitline addresses cause the counter value to increment and exceed the threshold.

If the bitline error counter exceeds the threshold in block 314, a bitline error condition is detected for the cache, as depicted in block 318. In embodiments, the comparison block 308 may accrue a set of errors and compare bitline addresses, where if a certain number of errors (non-consecutive or consecutive) within a selected time match bitline addresses and total a value greater than the threshold in block 314, the bitline error condition is detected in block 318. In an embodiment, detection of the bitline error condition occurs by a control unit in hardware or software. In block 320, a programmable switch is activated based on the control unit's detection of the bitline error condition. The activated programmable switch causes all subsequent cache errors to delete the error causing cache line, regardless of the wordline and bitline address of the error. This mode of line deletion may be referred to as automatic line deletion. The line delete process removes a location of corresponding line from available cache, such as by marking the line as unavailable in a cache directory. In block 322, the system continues to monitor the cache for errors, via hardware and/or software, where a no error condition is detected based on selected criteria. The detected no error condition (also referred to as "low error rate condition") causes deactivation of the programmable switch, thereby stopping the automatic line deletion for subsequent errors in the cache regardless of the wordline and bitline address. In an embodiment, lines deletes are still possible for specific types of errors via another method of error detection, for instance for an exact wordline and bitline address match for repeating errors. The no error condition may be detected by the control unit using software and/or hardware. In one embodiment, the no error condition is based on a selected number of cache line errors (consecutive or non-consecutive) having non-matching bitline addresses. Further, the number of non-matching errors may be compared to a threshold value that indicates the no error condition. In addition, the comparison may also have a time constraint, where a number of non-matching errors must exceed a threshold value in a selected time period to cause the no error condition. In another embodiment, the no error condition is based on an absence of detected line errors in the cache over a selected period of time.

Figure 4:
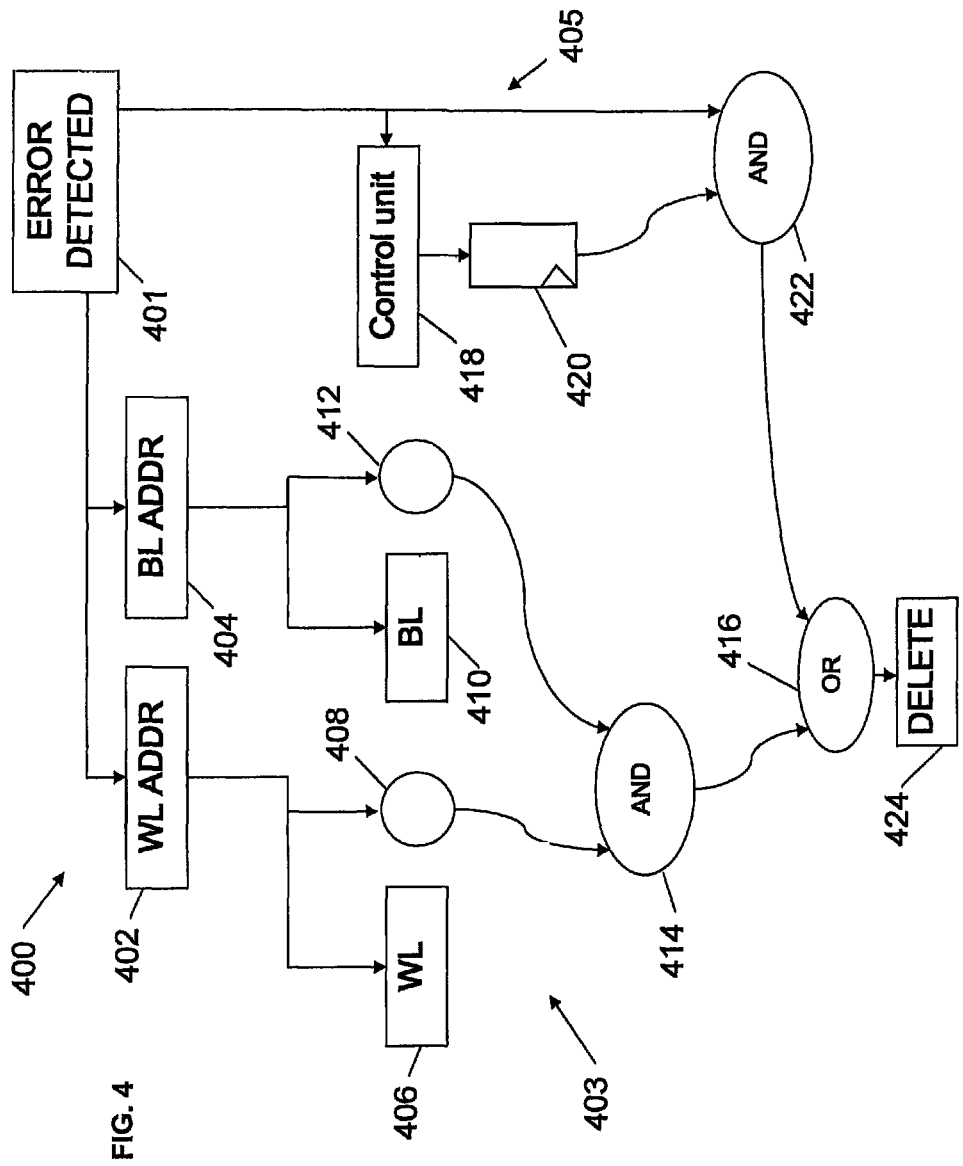
FIG. 4 illustrates a diagram of a system, process and logic for implementing bitline detection and deletion in accordance with an embodiment.

FIG. 4 is a diagram of an exemplary system, process and logic 400 for implementing bitline detection and deletion. All or a portion of the depicted logic may be implemented in software and/or hardware, depending on the application. In block 401, an error is detected for a cache line. The detected error can be used in a plurality of processes to delete failed lines, such as a precision detection process 403 and a switch controlled process 405. In the process 403, an address that caused the error is received, where the address includes a wordline address in block 402 and a bitline address in block 404. In block 408, the wordline address is compared to a previously recorded wordline address 406 to determine if the errors have matching wordline addresses. The recorded wordline address corresponds to the wordline address of a previous line error that was recorded in a suitable location, such as software or a register, as shown in block 406. The current wordline address of the error is also recorded in block 406. In block 412, the bitline address is compared to a previously recorded bitline address 410 to determine if the errors have matching bitline addresses. The recorded bitline address corresponds to the bitline address of the previous cache line error that was recorded to a location, such as software or a register, as shown in block 410. In addition, the current wordline address of the error is also recorded in block 410.

Following the address comparisons in blocks 408 and 412, the block 414 is an "and" function block that provides a yes or delete input to an "or" function block 416 if both addresses match for subsequent cache errors. If either compare block 408 or 412 results in a non-matching address, the block 414 provides a no delete input to the block 416. As depicted, the "or" function block 416 also receives a delete input from the switch controlled process 405, where either input can cause a line delete. A control unit 418 provides control of a programmable switch 420, where the control unit 418 may be integrated in the programmable switch 420 or may be a separate block. The control unit 418 may be implemented in hardware or software to control a hardware-implemented programmable switch 420. The control unit 418 may monitor errors (e.g., detected error 401) to determine a bitline error condition, such as described above, where the bitline error condition activates the programmable switch 420 to cause line deletes for all subsequent errors, regardless of the error address. In addition, the control unit 418 may continue to monitor the cache for a no error condition, such as described above, where the no error condition causes deactivation of the programmable switch 420. The deactivated programmable switch 420 stops the line delete for subsequent detected errors. The "and" function block 422 provides a line delete input to block 416 based on the programmable switch being activated and receiving a detected line error. The block 416 receives the inputs from blocks 414 and 422 and provides a delete command to block 424 for selected cache lines to be deleted.

Figure 5:
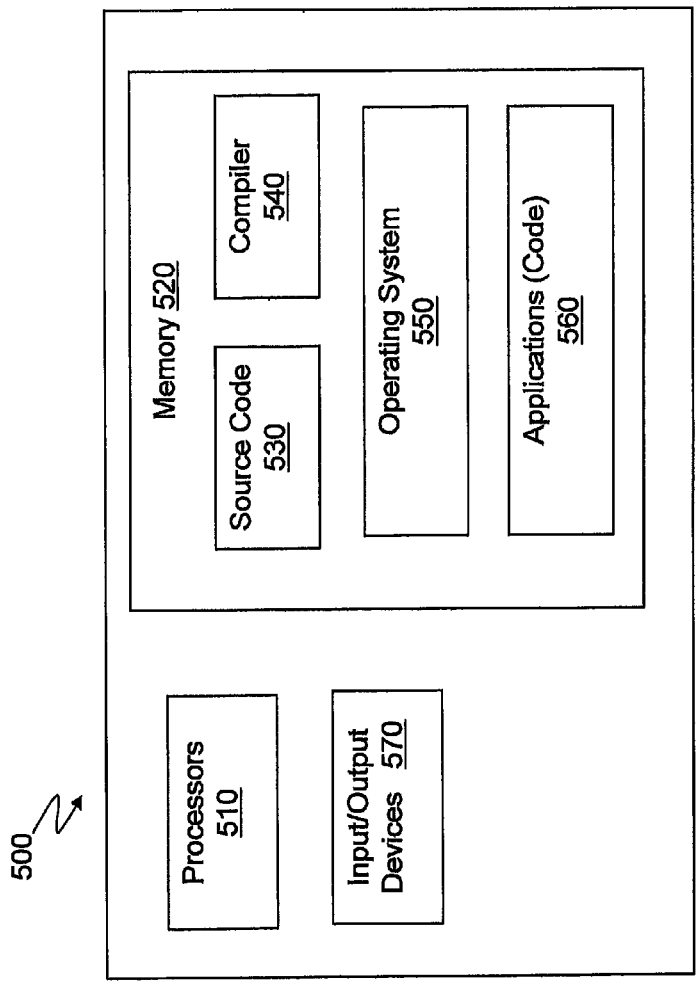
FIG. 5 illustrates an example of a computer having capabilities, which may be utilized in accordance with an embodiment.

FIG. 5 illustrates an example of a computer 500 having capabilities, which may be included in exemplary embodiments. Various methods, procedures, modules, flow diagrams, tools, application, circuits, elements, and techniques discussed herein may also incorporate and/or utilize the capabilities of the computer 500. Moreover, capabilities of the computer 500 may be utilized to implement features of exemplary embodiments discussed herein. One or more of the capabilities of the computer 500 may be utilized to implement, to connect to, and/or to support any element discussed herein (as understood by one skilled in the art) in FIGS. 1-4 and 6.

Generally, in terms of hardware architecture, the computer 500 may include one or more processors 510, computer readable storage memory 520, and one or more input and/or output (I/O) devices 570 that are communicatively coupled via a local interface (not shown). The local interface can be, for example but not limited to, one or more buses or other wired or wireless connections, as is known in the art. The local interface may have additional elements, such as controllers, buffers (caches), drivers, repeaters, and receivers, to enable communications. Further, the local interface may include address, control, and/or data connections to enable appropriate communications among the aforementioned components.

The processor 510 is a hardware device for executing software that can be stored in the memory 520. The processor 510 can be virtually any custom made or commercially available processor, a central processing unit (CPU), a data signal processor (DSP), or an auxiliary processor among several processors associated with the computer 500, and the processor 510 may be a semiconductor based microprocessor (in the form of a microchip) or a macroprocessor.

The computer readable memory 520 can include any one or combination of volatile memory elements (e.g., random access memory (RAM), such as dynamic random access memory (DRAM), static random access memory (SRAM), etc.) and nonvolatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, etc.). Moreover, the memory 520 may incorporate electronic, magnetic, optical, and/or other types of storage media. Note that the memory 520 can have a distributed architecture, where various components are situated remote from one another, but can be accessed by the processor 510.

The software in the computer readable memory 520 may include one or more separate programs, each of which comprises an ordered listing of executable instructions for implementing logical functions. The software in the memory 520 includes a suitable operating system (O/S) 550, compiler 540, source code 530, and one or more applications 560 of the exemplary embodiments. As illustrated, the application 560 comprises numerous functional components for implementing the features, processes, methods, functions, and operations of the exemplary embodiments. The application 560 of the computer 500 may represent numerous applications, agents, software components, modules, interfaces, controllers, etc., as discussed herein but the application 560 is not meant to be a limitation.

The operating system 550 may control the execution of other computer programs, and provides scheduling, input-output control, file and data management, memory management, and communication control and related services.

The application(s) 560 may employ a service-oriented architecture, which may be a collection of services that communicate with each. Also, the service-oriented architecture allows two or more services to coordinate and/or perform activities (e.g., on behalf of one another). Each interaction between services can be self-contained and loosely coupled, so that each interaction is independent of any other interaction.

Further, the application 560 may be a source program, executable program (object code), script, or any other entity comprising a set of instructions to be performed. When a source program, then the program is usually translated via a compiler (such as the compiler 540), assembler, interpreter, or the like, which may or may not be included within the memory 520, so as to operate properly in connection with the O/S 550. Furthermore, the application 560 can be written as (a) an object oriented programming language, which has classes of data and methods, or (b) a procedure programming language, which has routines, subroutines, and/or functions.

The I/O devices 570 may include input devices (or peripherals) such as, for example but not limited to, a mouse, keyboard, scanner, microphone, camera, etc. Furthermore, the I/O devices 570 may also include output devices (or peripherals), for example but not limited to, a printer, display, etc. Finally, the I/O devices 570 may further include devices that communicate both inputs and outputs, for instance but not limited to, a NIC or modulator/demodulator (for accessing remote devices, other files, devices, systems, or a network), a radio frequency (RF) or other transceiver, a telephonic interface, a bridge, a router, etc. The I/O devices 570 also include components for communicating over various networks, such as the Internet or an intranet. The I/O devices 570 may be connected to and/or communicate with the processor 510 utilizing Bluetooth connections and cables (via, e.g., Universal Serial Bus (USB) ports, serial ports, parallel ports, FireWire, HDMI (High-Definition Multimedia Interface), etc.).

When the computer 500 is in operation, the processor 510 is configured to execute software stored within the memory 520, to communicate data to and from the memory 520, and to generally control operations of the computer 500 pursuant to the software. The application 560 and the O/S 550 are read, in whole or in part, by the processor 510, perhaps buffered within the processor 510, and then executed.

When the application 560 is implemented in software it should be noted that the application 560 can be stored on virtually any computer readable storage medium for use by or in connection with any computer related system or method. In the context of this document, a computer readable storage medium may be an electronic, magnetic, optical, or other physical device or means that can contain or store a computer program for use by or in connection with a computer related system or method.

The application 560 can be embodied in any computer-readable medium 520 for use by or in connection with an instruction execution system, apparatus, server, or device, such as a computer-based system, processor-containing system, or other system that can fetch the instructions from the instruction execution system, apparatus, or device and execute the instructions. In the context of this document, a "computer-readable storage medium" can be any means that can store, read, write, communicate, or transport the program for use by or in connection with the instruction execution system, apparatus, or device. The computer readable medium can be, for example but not limited to, an electronic, magnetic, optical, or semiconductor system, apparatus, or device.

More specific examples (a nonexhaustive list) of the computer-readable medium 520 would include the following: an electrical connection (electronic) having one or more wires, a portable computer diskette (magnetic or optical), a random access memory (RAM) (electronic), a read-only memory (ROM) (electronic), an erasable programmable read-only memory (EPROM, EEPROM, or Flash memory) (electronic), an optical fiber (optical), and a portable compact disc memory (CDROM, CD R/W) (optical).

In exemplary embodiments, where the application 560 is implemented in hardware, the application 560 can be implemented with any one or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

It is understood that the computer 500 includes non-limiting examples of software and hardware components that may be included in various devices, servers, and systems discussed herein, and it is understood that additional software and hardware components may be included in the various devices and systems discussed in exemplary embodiments.

Figure 6:
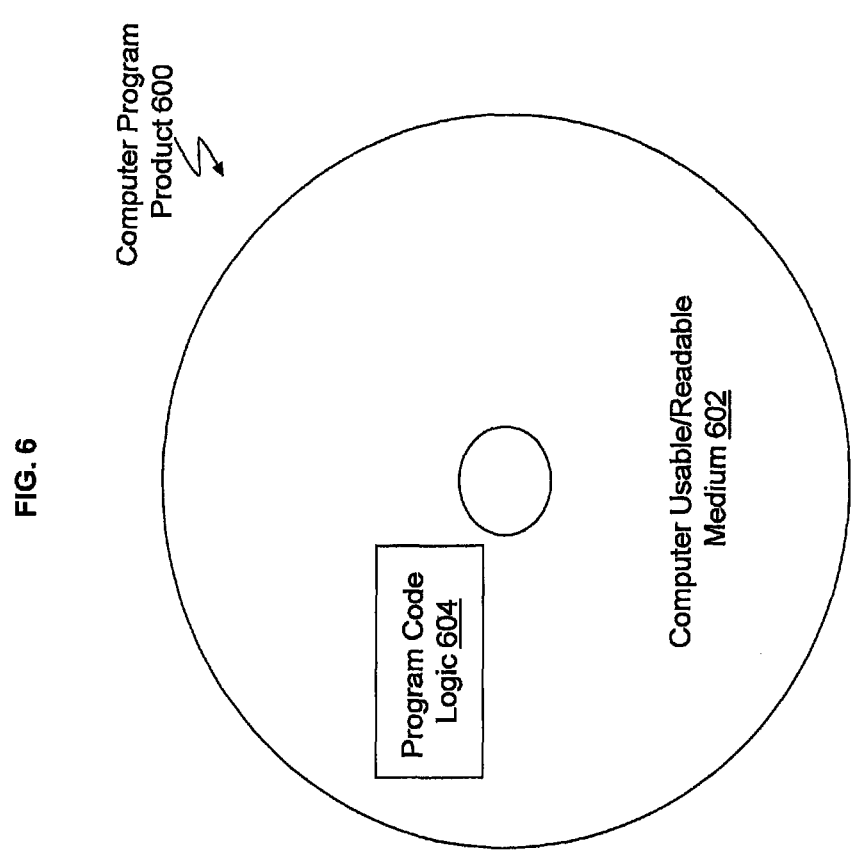
FIG. 6 illustrates an example of a computer program product on a computer readable/usable medium with computer program code logic embodied in tangible media as an article of manufacture.

As described above, embodiments can be embodied in the form of computer-implemented processes and apparatuses for practicing those processes. An embodiment may include a computer program product 600 as depicted in FIG. 6 on a computer readable/usable medium 602 with computer program code logic 604 containing instructions embodied in tangible media as an article of manufacture. Exemplary articles of manufacture for computer readable/usable medium 602 may include floppy diskettes, CD-ROMs, hard drives, universal serial bus (USB) flash drives, or any other computer-readable storage medium, wherein, when the computer program code logic 604 is loaded into and executed by a computer, the computer becomes an apparatus. Embodiments include computer program code logic 604, for example, whether stored in a storage medium, loaded into and/or executed by a computer, or transmitted over some transmission medium, such as over electrical wiring or cabling, through fiber optics, or via electromagnetic radiation, wherein, when the computer program code logic 604 is loaded into and executed by a computer, the computer becomes an apparatus. When implemented on a general-purpose microprocessor, the computer program code logic 604 segments configure the microprocessor to create specific logic circuits.

As will be appreciated by one skilled in the art, one or more aspects of the present invention may be embodied as a system, method or computer program product. Accordingly, one or more aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system". Furthermore, one or more aspects of the present invention may take the form of a computer program product embodied in one or more computer readable medium(s) having computer readable program code embodied thereon.

Any combination of one or more computer readable medium(s) may be utilized. The computer readable medium may be a computer readable storage medium. A computer readable storage medium may be, for example, but not limited to, an electronic, magnetic, optical, electromagnetic, infrared or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

Referring now to FIG. 6, in one example, a computer program product 600 includes, for instance, one or more storage media 602, wherein the media may be tangible and/or non-transitory, to store computer readable program code means or logic 604 thereon to provide and facilitate one or more aspects of embodiments described herein.

Program code, when created and stored on a tangible medium (including but not limited to electronic memory modules (RAM), flash memory, Compact Discs (CDs), DVDs, Magnetic Tape and the like is often referred to as a "computer program product". The computer program product medium is typically readable by a processing circuit preferably in a computer system for execution by the processing circuit. Such program code may be created using a compiler or assembler for example, to assemble instructions, that, when executed perform aspects of the invention.

Embodiments relate to a computer system, method and computer program product for bitline deletion, the method including, based on detecting a high bitline error rate condition in the cache at a selected bitline address, wherein the high bitline error rate condition indicates a high rate of errors at the selected bitline address, activating the programmable switch in the cache. The method also includes, based on the programmable switch being activated and encountering an error associated with the selected bitline address, automatically deleting, by the computer system, one or more cache lines associated with subsequent errors in the cache regardless of an address of the subsequent errors based on the activated programmable switch, wherein the automatic line deletion indicates a line is unavailable.

In an embodiment, detecting the bitline error condition further includes recording a first bitline address and a first wordline address of a first error in the cache; recording a second bitline address and a second wordline address of a second error in the cache; comparing the first bitline address to the second bitline address; comparing the first wordline address to the second wordline address; determining a number of errors that occur on the selected bitline address based on a matching compare of the first bitline address and the second bitline address and a non-matching compare of the first wordline address and the second wordline address; and detecting the high bitline error rate condition based on the number of errors being greater than a threshold.

In an embodiment, detecting the high bitline error rate condition based on the number of errors being greater than the threshold comprises detecting the high bitline error rate condition based on the number of errors being greater than the threshold during a time period.

In an embodiment, automatically deleting one or more cache lines associated with the subsequent errors in the cache comprises deleting one or more caches lines associated with subsequent correctable errors and uncorrectable errors in the cache.

In an embodiment, the method further includes based on an absence of errors being detected in the cache during a time period, detecting a low error rate condition, wherein the low error rate condition indicates a low rate of errors in the cache; based on detecting the low error rate condition, deactivating the programmable switch; and based on the programmable switch being deactivated and encountering correctable errors, not deleting cache lines associated with the correctable errors.

In an embodiment, the method further includes recording a first bitline address of a first error in the cache; recording a second bitline address of a second error in the cache; comparing the first bitline address and the second bitline address; detecting a low error rate condition based on the first bitline address and the second bitline address not matching; based on detecting the low error rate condition, deactivating the programmable switch; and based on the programmable switch being deactivated and encountering correctable errors, not deleting cache lines associated with the correctable errors.

Technical effects and benefits include improved memory performance due to enhanced bitline deletion following failure of a bitline in a memory device. In an embodiment, software and/or hardware determine a bitline error condition and activate a programmable switch to delete all subsequent errors from use in the cache. Embodiments provide improved memory performance by removing sections of cache that are failed following detection of the bitline error condition, thus enabling the memory system to detect and correct other errors (e.g., soft errors) that may not be corrected when failed bitlines are available.

The terminology used herein is for the purpose of describing particular embodiments only and is not intended to be limiting of embodiments. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of embodiments have been presented for purposes of illustration and description, but is not intended to be exhaustive or limited to the embodiments in the form disclosed. Many modifications and variations will be apparent to those of ordinary skill in the art without departing from the scope and spirit of the embodiments. The embodiments were chosen and described in order to best explain the principles and the practical application, and to enable others of ordinary skill in the art to understand the embodiments with various modifications as are suited to the particular use contemplated.

Computer program code for carrying out operations for aspects of the embodiments may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of embodiments are described above with reference to flowchart illustrations and/or schematic diagrams of methods, apparatus (systems) and computer program products according to embodiments. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various embodiments. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A computer system for bitline deletion, the system comprising:
    a cache and a programmable switch, the system configured to perform a method comprising:
    based on comparing bitline addresses of errors in the cache and determining a number of errors with matching bitline addresses being greater than a threshold, detecting a high bitline error rate condition in the cache at a selected bitline address corresponding to the matching bitline addresses;
    based on detecting the high bitline error rate condition in the cache at the selected bitline address, activating the programmable switch in the cache; and
    based on the programmable switch being activated and encountering an error associated with the selected bitline address, automatically deleting, by the computer system, one or more cache lines associated with subsequent errors in the cache regardless of an address of the subsequent errors based on the activated programmable switch, wherein the automatic line deletion indicates a line is unavailable.

2. The computer system of claim 1, wherein detecting the high bitline error rate condition comprises:
    recording a first bitline address and a first wordline address of a first error in the cache;
    recording a second bitline address and a second wordline address of a second error in the cache;
    comparing the first bitline address to the second bitline address;
    comparing the first wordline address to the second wordline address;
    determining a number of errors that occur on the selected bitline address based on a matching compare of the first bitline address and the second bitline address and a non-matching compare of the first wordline address and the second wordline address; and
    detecting the high bitline error rate condition based on the number of errors being greater than a threshold.

3. The computer system of claim 2, wherein detecting the high bitline error rate condition based on the number of errors being greater than the threshold comprises detecting the high bitline error rate condition based on the number of errors being greater than the threshold during a time period.

4. The computer system of claim 1, wherein automatically deleting one or more cache lines associated with the subsequent errors in the cache comprises deleting one or more caches lines associated with subsequent correctable errors and uncorrectable errors in the cache.

5. The computer system of claim 1, comprising:
    based on an absence of errors being detected in the cache during a time period, detecting a low error rate condition, wherein the low error rate condition indicates a low rate of errors in the cache;
    based on detecting the low error rate condition, deactivating the programmable switch; and
    based on the programmable switch being deactivated and encountering correctable errors, not deleting cache lines associated with the correctable errors.

6. The computer system of claim 1, comprising:
    recording a first bitline address of a first error in the cache;
    recording a second bitline address of a second error in the cache;
    comparing the first bitline address and the second bitline address;
    detecting a low error rate condition based on the first bitline address and the second bitline address not matching;
    based on detecting the low error rate condition, deactivating the programmable switch; and
    based on the programmable switch being deactivated and encountering correctable errors, not deleting cache lines associated with the correctable errors.

7. A method for bitline deletion, the method comprising:
    based on comparing bitline addresses of errors in a cache and determining a number of errors with matching bitline addresses being greater than a threshold, detecting a high bitline error rate condition in the cache at a selected bitline address corresponding to the matching bitline addresses;
    based on detecting the high bitline error rate condition in the cache at the selected bitline address, activating a programmable switch in the cache; and
    based on the programmable switch being activated and encountering an error associated with the selected bitline address, automatically deleting, by a computer system, one or more cache lines associated with subsequent errors in the cache regardless of an address of the subsequent errors based on the activated programmable switch, wherein the automatic line deletion indicates a line is unavailable.

8. The method of claim 7, wherein detecting the high bitline error rate condition comprises:
   recording a first bitline address and a first wordline address of a first error in the cache;
   recording a second bitline address and a second wordline address of a second error in the cache;
   comparing the first bitline address to the second bitline address;
   comparing the first wordline address to the second wordline address;
   determining a number of errors that occur on the selected bitline address based on a matching compare of the first bitline address and the second bitline address and a non-matching compare of the first wordline address and the second wordline address; and
   detecting the high bitline error rate condition based on the number of errors being greater than a threshold.

9. The method of claim 8, wherein detecting the high bitline error rate condition based on the number of errors being greater than the threshold comprises detecting the high bitline error rate condition based on the number of errors being greater than the threshold during a time period.

10. The method of claim 7, wherein automatically deleting one or more cache lines associated with the subsequent errors in the cache comprises deleting one or more cache lines associated with subsequent correctable errors and uncorrectable errors in the cache.

11. The method of claim 7, comprising:
   based on an absence of errors being detected in the cache during a time period, detecting a low error rate condition, wherein the low error rate condition indicates a low rate of errors in the cache;
   based on detecting the low error rate condition, deactivating the programmable switch; and
   based on the programmable switch being deactivated and encountering correctable errors, not deleting cache lines associated with the correctable errors.

12. The method of claim 7, comprising:
   recording a first bitline address of a first error in the cache;
   recording a second bitline address of a second error in the cache;
   comparing the first bitline address and the second bitline address;
   detecting a no error condition based on the first bitline address and the second bitline address not matching; and
   deactivating the programmable switch based on the no error condition, the deactivating of the programmable switch stopping automatic line deletion for subsequent errors.

13. The method of claim 12, wherein detecting the no error condition comprises:
   determining a number of consecutive errors with bitline addresses that do not match; and
   detecting the no error condition based on the number of consecutive errors with bitline addresses that do not match being greater than a threshold.

14. A computer program product for implementing a line deletion, the computer program product comprising:
   a tangible non-transitory storage medium readable by a processing circuit and storing instructions for execution by the processing circuit for performing a method comprising:
      based on comparing bitline addresses of errors in a cache and determining a number of errors with matching bitline addresses being greater than a threshold, detecting a high bitline error rate condition in the cache at a selected bitline address corresponding to the matching bitline addresses;
      based on detecting the high bitline error rate condition in the cache at the selected bitline address, activating a programmable switch in the cache;
      based on the programmable switch being activated and encountering an error associated with the selected bitline address, automatically deleting, by a computer system, one or more cache lines associated with subsequent errors in the cache regardless of an address of the subsequent errors based on the activated programmable switch, wherein the automatic line deletion indicates a line is unavailable.

15. The computer program product of claim 14, wherein detecting the high bitline error rate condition comprises:
   recording a first bitline address and a first wordline address of a first error in the cache;
   recording a second bitline address and a second wordline address of a second error in the cache;
   comparing the first bitline address to the second bitline address;
   comparing the first wordline address to the second wordline address;
   determining a number of errors that occur on the selected bitline address based on a matching compare of the first bitline address and the second bitline address and a non-matching compare of the first wordline address and the second wordline address; and
   detecting the high bitline error rate condition based on the number of errors being greater than a threshold.

16. The computer program product of claim 15, wherein detecting the high bitline error rate condition based on the number of errors being greater than the threshold comprises detecting the high bitline error rate condition based on the number of errors being greater than the threshold during a time period.

17. The computer program product of claim 14, wherein automatically deleting one or more cache lines associated with the subsequent errors in the cache comprises deleting one or more cache lines associated with subsequent correctable errors and uncorrectable errors in the cache.

18. The computer program product of claim 14, comprising:
   based on an absence of errors being detected in the cache during a time period, detecting a low error rate condition, wherein the low error rate condition indicates a low rate of errors in the cache;
   based on detecting the low error rate condition, deactivating the programmable switch; and
   based on the programmable switch being deactivated and encountering correctable errors, not deleting cache lines associated with the correctable errors.

19. The computer program product of claim 14, comprising:
   recording a first bitline address of a first error in the cache;
   recording a second bitline address of a second error in the cache;
   comparing the first bitline address and the second bitline address;
   detecting a low error rate condition based on the first bitline address and the second bitline address not matching;
   based on detecting the low error rate condition, deactivating the programmable switch; and based on the programmable switch being deactivated and encountering correctable errors, not deleting cache lines associated with the correctable errors.

20. The computer program product of claim 19, wherein detecting the low error rate condition comprises:
  determining a number of consecutive errors with bitline addresses that do not match; and
  detecting the low error rate condition based on the number of consecutive errors with bitline addresses that do not match being greater than a threshold.

21. A computer system for bitline deletion, the system comprising:
  a cache and a programmable switch, the system configured to perform a method comprising:
  based on detecting a high bitline error rate condition in a cache at a selected bitline address, wherein the high bitline error rate condition indicates a high rate of errors at the selected bitline address, activating a programmable switch in the cache;
  based on the programmable switch being activated and encountering an error associated with the selected bitline address, automatically deleting, by the computer system, one or more cache lines associated with subsequent errors in the cache regardless of an address of the subsequent errors based on the activated programmable switch, wherein the automatic line deletion indicates a line is unavailable; and
  based on detecting a low error rate condition, the low error rate condition comprising a number of consecutive errors with bitline addresses that do not match being greater than a threshold, deactivating the programmable switch.

* * * * *